(12) United States Patent
Parekh (10) Patent No.: US 12,362,243 B2
(45) Date of Patent: Jul. 15, 2025

(54) SEMICONDUCTOR DEVICE ASSEMBLIES INCLUDING TSVs OF DIFFERENT LENGTHS AND METHODS OF MAKING THE SAME

(71) Applicant: Micron Technology, Inc., Boise, ID (US)

(72) Inventor: Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 429 days.

(21) Appl. No.: 17/719,158

(22) Filed: Apr. 12, 2022

(65) Prior Publication Data
US 2023/0139278 A1 May 4, 2023

Related U.S. Application Data

(60) Provisional application No. 63/274,419, filed on Nov. 1, 2021.

(51) Int. Cl.
*H01L 21/66* (2006.01)
*H01L 21/768* (2006.01)
*H01L 23/31* (2006.01)
*H01L 23/48* (2006.01)
*H01L 23/528* (2006.01)

(52) U.S. Cl.
CPC ........ *H01L 22/32* (2013.01); *H01L 21/76898* (2013.01); *H01L 23/31* (2013.01); *H01L 23/3128* (2013.01); *H01L 23/481* (2013.01); *H01L 23/5283* (2013.01)

(58) Field of Classification Search
CPC ... H01L 22/32; H01L 21/76898; H01L 23/31; H01L 23/481; H01L 2225/06513; H01L 2225/06541; H01L 2225/06568; H01L 25/50; H01L 23/5226; H01L 25/16; H01L 25/18
See application file for complete search history.

(56) References Cited

U.S. PATENT DOCUMENTS

2019/0259677 A1* 8/2019 Lasiter ............. H01L 21/76802
2020/0294908 A1* 9/2020 Haba ..................... H01L 24/08
(Continued)

OTHER PUBLICATIONS

Vettori, "General overview on pad damage: probe key parameters and other causes.," SW test workshop, 2016 (Year: 2016).*

*Primary Examiner* — Joseph C. Nicely
*Assistant Examiner* — Alvin L Lee (57) ABSTRACT

A semiconductor device assembly includes a first semiconductor device having front and rear surfaces, a plurality of front-side pads disposed over the front surface at a first distance from the rear surface, and a plurality of additional device pads disposed over the front surface at a second distance from the rear surface greater than the first distance; a second semiconductor device in contact with a top side of each of the additional device pads; an encapsulant material at least partially surrounding the second semiconductor device and covering a top side of the front-side pads; a first plurality of TSVs, each extending from the rear surface through the first semiconductor device to a bottom side of one of the front-side pads; and a second plurality of TSVs, each extending from the rear surface through the first semiconductor device to a bottom side of corresponding one of the additional device pads.

20 Claims, 6 Drawing Sheets

(56) References Cited

U.S. PATENT DOCUMENTS

2021/0305112 A1* 9/2021 Tseng ............... H01L 21/56
2022/0223565 A1* 7/2022 Chen ................ H01L 24/08
2023/0035032 A1* 2/2023 Kim ................. H01L 25/0657

* cited by examiner

SEMICONDUCTOR DEVICE ASSEMBLIES INCLUDING TSVs OF DIFFERENT LENGTHS AND METHODS OF MAKING THE SAME

CROSS-REFERENCE TO RELATED APPLICATION(S)

The present application claims priority to U.S. Provisional Patent Application No. 63/274,419, filed Nov. 1, 2021, the disclosure of which is incorporated herein by reference in its entirety.

TECHNICAL FIELD

The present disclosure generally relates to semiconductor device assemblies, and more particularly relates to semiconductor device assemblies including TSVs of different lengths and methods of making the same.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

DETAILED DESCRIPTION

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Some semiconductor device assemblies include multiple semiconductor devices of different types (e.g., logic, memory, sensors, etc.) integrated into a heterogenous assembly. Routing electrical connections for each of these devices to external contacts of the assembly continues to pose challenges as the overall scale of assemblies shrinks and their complexity increases. To address these drawbacks and others, various embodiments of the present application provide assemblies with pluralities of TSVs of different lengths to reach different devices in the assemblies, which can be formed after the devices have been preliminarily assembled and optionally tested.

Figure 1:
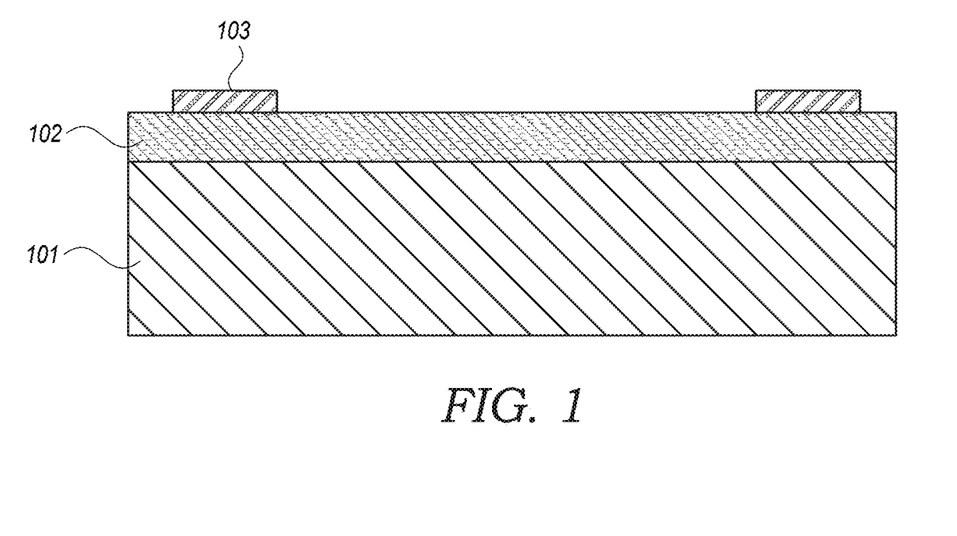
FIGS. 1 through 10 are simplified schematic partial cross-sectional views of semiconductor device assemblies at various stages in a process of fabrication in accordance with embodiments of the present disclosure.

FIG. 1 is a simplified schematic cross-sectional view of a semiconductor device assembly at one stage in a process of fabrication in accordance with an embodiment of the present disclosure. A first semiconductor device 101 (e.g., an unsingulated device still in wafer or panel form in some embodiments, or a singulated device in other embodiments) includes a passivation layer 102 (e.g., of dielectric material, such an oxide, a nitride, a silicide, etc.) at a front (e.g., active) surface thereof (e.g., at a side of the silicon or other semiconducting bulk material in which circuitry has been formed), in or on which are disposed front-side contacts 103 (e.g., metal pads). Front-side contacts 103 may be electrically coupled to different circuits formed in first semiconductor device 101 by various conductive features such as vias, traces, lines, pads, etc. (not illustrated). In accordance with one aspect of the present disclosure, first semiconductor device 101 can be a logic device (e.g., a processor, a controller, a deep learning accelerator (DLA), etc.). In other embodiments, first semiconductor device 101 can be another kind of semiconductor device (e.g., a memory device, a transceiver device, an optical sensor, etc.).

Figure 2:
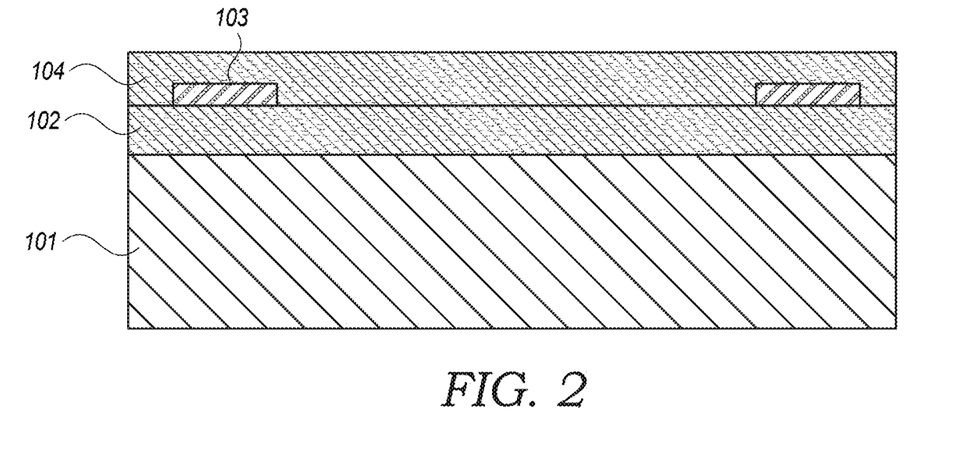
Figure 3:
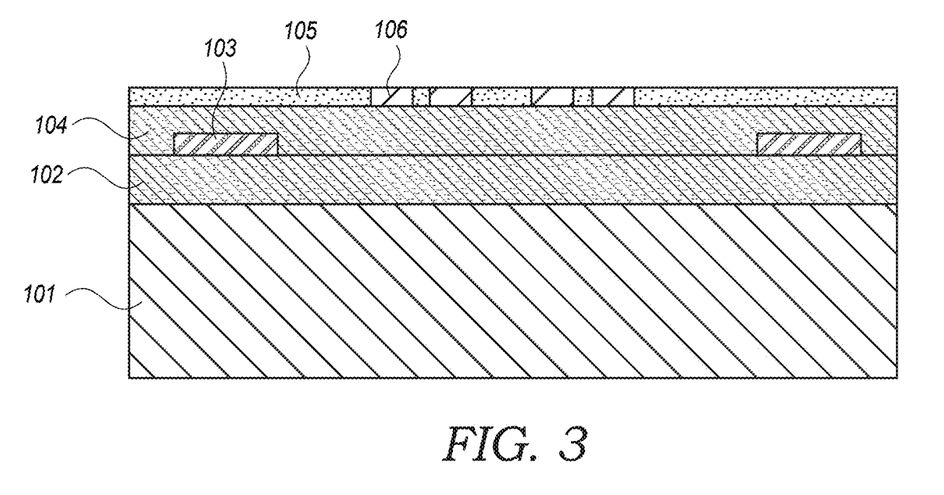

Turning to FIG. 2, a second passivation layer 104 (e.g., of another dielectric material, which may be the same material or a different material than that of passivation layer 102) is disposed over both the front-side contacts 103 and the passivation layer 102. Turning to FIG. 3, it can be seen that second passivation layer 104 provides a surface upon which a plurality of additional device pads 106 can be carried. As can be seen with reference to FIG. 3, additional device pads 106 are formed in or on a third passivation layer 105 (e.g., of another dielectric material, which may be the same material or a different material than that of passivation layer 102 and second passivation layer 104). Accordingly, additional device pads 106 are disposed at a greater distance (e.g., corresponding to a thickness of the second passivation layer 104) from a rear surface of first semiconductor device 101 (e.g., a rear surface opposite the front surface) than are front-side contacts 103. In an alternative embodiment, however, additional device contacts may be formed in or on the passivation layer 102 and generally co-planar with front-side contacts 103.

Figure 4:
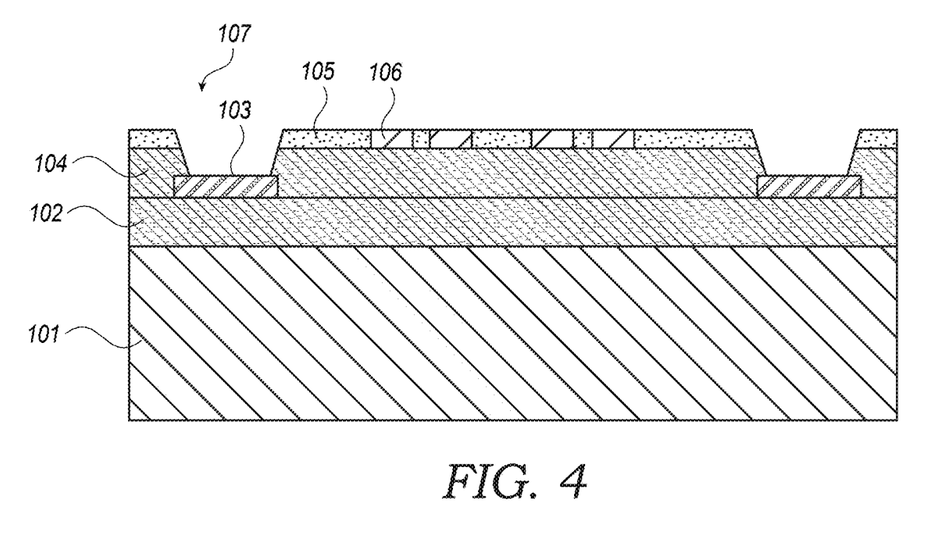

Unlike front-side contacts 103, additional device pads 106 are electrically isolated from circuitry in the first semiconductor device 101, and provide a mounting location for additional semiconductor devices to be carried by first semiconductor device 101. Prior to attaching additional semiconductor devices to the additional device pads 106, however, it may be advantageous to test the first semiconductor device 101 (e.g., each of the first semiconductor devices 101 in a wafer comprising a plurality thereof) to avoid a circumstance in which additional semiconductor devices are wastefully coupled to a non-functional or otherwise defective first semiconductor device 101. Accordingly, as can be seen with reference to FIG. 4, openings 107 may be formed in the second passivation layer 104 (e.g., and the third passivation layer 105) and aligned with the front-side contacts 103 to permit a test operation (e.g., utilizing probe pins, probe cards, or the like) to be performed on the circuits of the first semiconductor device 101 to which the front-side contacts 103 are electrically coupled.

Figure 5:
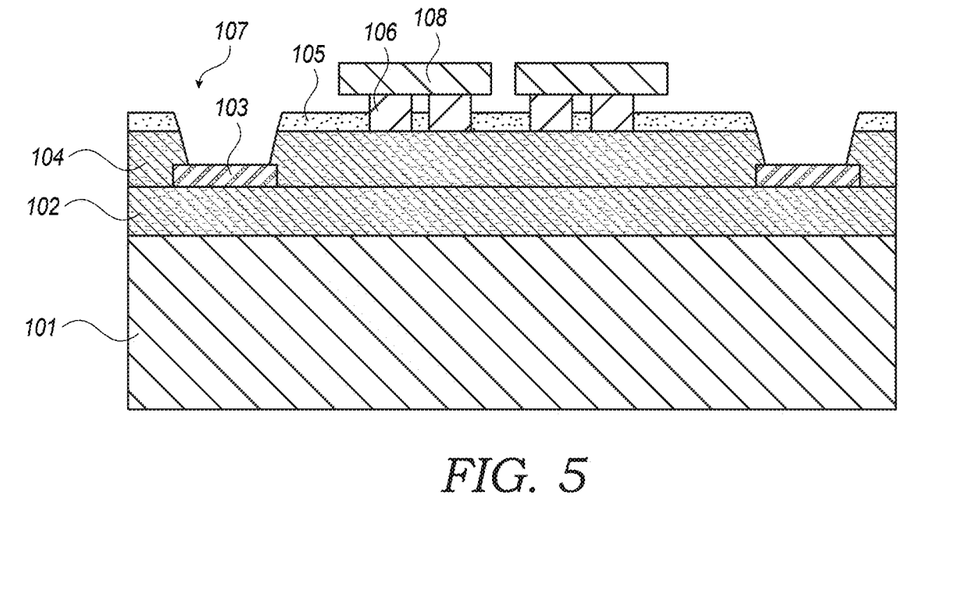

Turning to FIG. 5, having determined that first semiconductor device 101 can sustain a level of functional performance warranting integration into an assembly, additional semiconductor devices 108 (e.g., individual dies, vertical stacks of interconnected dice, device packages, device assemblies, etc.) are illustrated after having been attached to additional device pads 106 (e.g., by a flip-chip attachment process, or any other device attachment methodology well-known to those of skill in the art). Additional semiconductor devices 108 can be memory devices (e.g., DRAM, NAND, PCM, 3DXP, etc.), logic devices (e.g., controllers, processors, accelerators, etc.), or any other kind of semiconductor device according to various embodiments of the present disclosure.

As will be readily understood by those of skill in the art, test operations that employ probe pins can cause mechanical damage to contacts, such that the top (e.g., exposed, in FIG. 4) surface of the front-side contacts 103 may no longer be suitable for bonding to another structure (e.g., due to the scratches, gouges, dents, grooves, cavities, or even overhanging folds of material caused by the contact between a probe pin and the top surface of the front-side contacts 103). An advantage of the present disclosure, as will be explained in greater detail below, is that a single pad can be used both for a probe operation (ensuring that functional additional devices are not wastefully coupled to a defective first semiconductor device) and for bonding to another structure, but without requiring any cleaning or restoration operation to repair the top surface of the front-side contacts 103.

Figure 6:
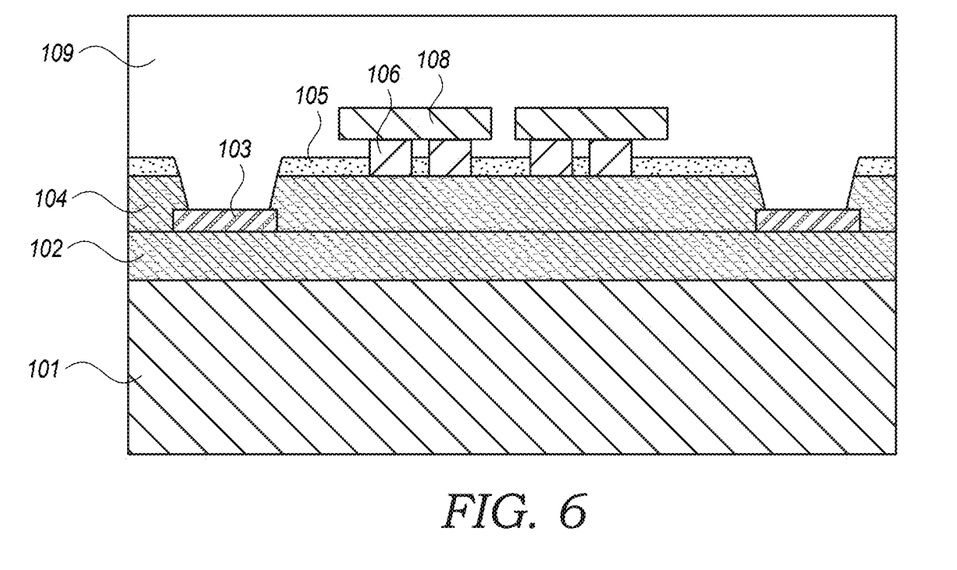

In this regard, rather than forming interconnects to connect the top surface of the front side contacts 103 to another structure (e.g., a higher-level device to which the assembly is connected, such as a motherboard, daughterboard, expansion board, or other printed circuit board), embodiments of the present disclosure can instead provide connectivity to front side contacts 103 (and, optionally, to additional device pads 106) by way of a bottom surface thereof (e.g., a surface facing the first semiconductor device 101). Accordingly, an encapsulant (e.g., mold material) 109 can be formed over the front surface of the first semiconductor device, covering the front side contacts 103 and at least partially surrounding the additional semiconductor devices 108. The encapsulant 109 can provide a mechanically-robust planar surface for attachment to a temporary carrier wafer (not illustrated) during processes performed on or at a rear surface of the first semiconductor device 101 opposite the front surface.

Figure 7:
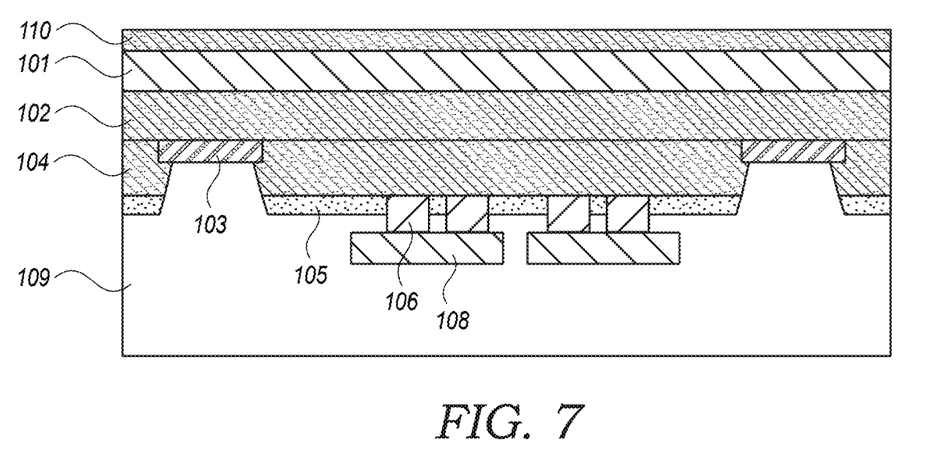

Turning to FIG. 7, in accordance with an embodiment of the present disclosure, a schematic partial cross-sectional view of the semiconductor device assembly is illustrated at a stage in a process of fabrication in which the assembly (e.g., still at a wafer or panel level in some embodiments, or in other embodiments, a singulated device level) has been attached (via the encapsulant 109) to a temporary carrier wafer (not illustrated) to permit a rear-surface thinning operation (e.g., via chemical-mechanical polishing (CMP), grinding, wet etching, etc.). As can be seen with reference to FIG. 7, first semiconductor device 101 has been thinned by removing a portion of the bulk semiconductor material thereof to reduce a total height of the eventual assembly of which it will form a part and to facilitate the formation of through-silicon vias (TSVs), and a layer of passivation material 110 (e.g., of another dielectric material, which may be the same material or a different material than that of passivation layer 102, second passivation layer 104, and/or third passivation layer 105) has been formed over the rear surface of the first semiconductor device following the thinning operation.

Figure 8:
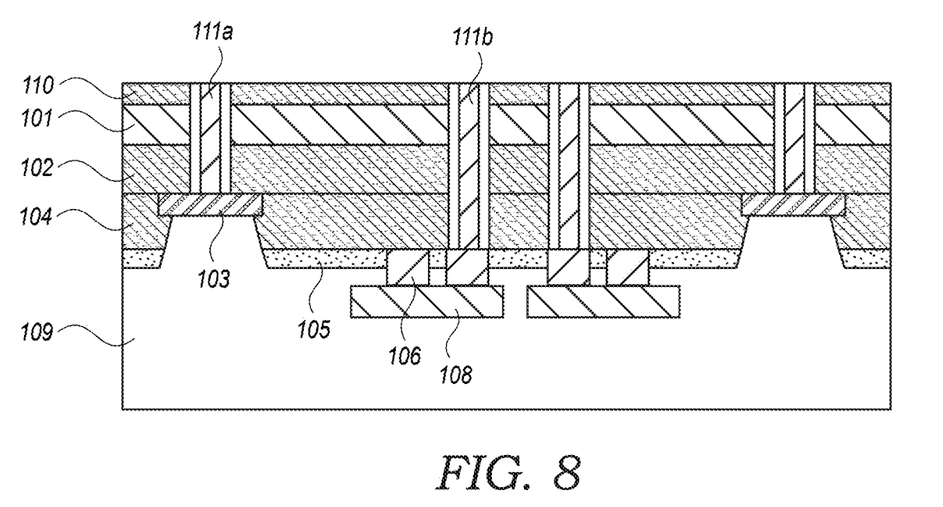

With first semiconductor device 101 having been thinned, through silicon vias (TSVs) can now more easily be formed from the rear surface of the first semiconductor device, extending to bottom sides of each of the front-side contacts 103 and the additional device pads 106, as can be seen with reference to the schematic partial cross-sectional view illustrated in FIG. 8. The TSVs may include a first plurality of TSVs 111a extending from a rear surface of the first semiconductor device 101 to bottom surfaces (n.b., both illustrated facing upwardly in the inverted orientation of FIG. 8) of the front-side contacts 103, and a second plurality of TSVs 111b extending from the rear surface of the first semiconductor device 101 to bottom surfaces of the additional device pads 106. The TSVs can be formed according to conventional processes well-known to those of skill in the art (e.g., forming openings through the outer passivation and the bulk silicon material, passivating the openings, removing the passivation from the bottom of the openings to expose the bottom surfaces of the contacts, plating a conductor into the openings, etc.).

As can be seen with reference to the embodiment illustrated in FIG. 8, the first and second pluralities of TSVS 111a and 111b have different lengths, in which the difference in length corresponds to a thickness of the second passivation layer 104. In an alternative embodiment, however, in which additional device contacts 106 are formed in or on the passivation layer 102 and generally co-planar with front-side contacts 103, the lengths of the first and second pluralities of TSVS 111a and 111b may be the same.

Figure 9:
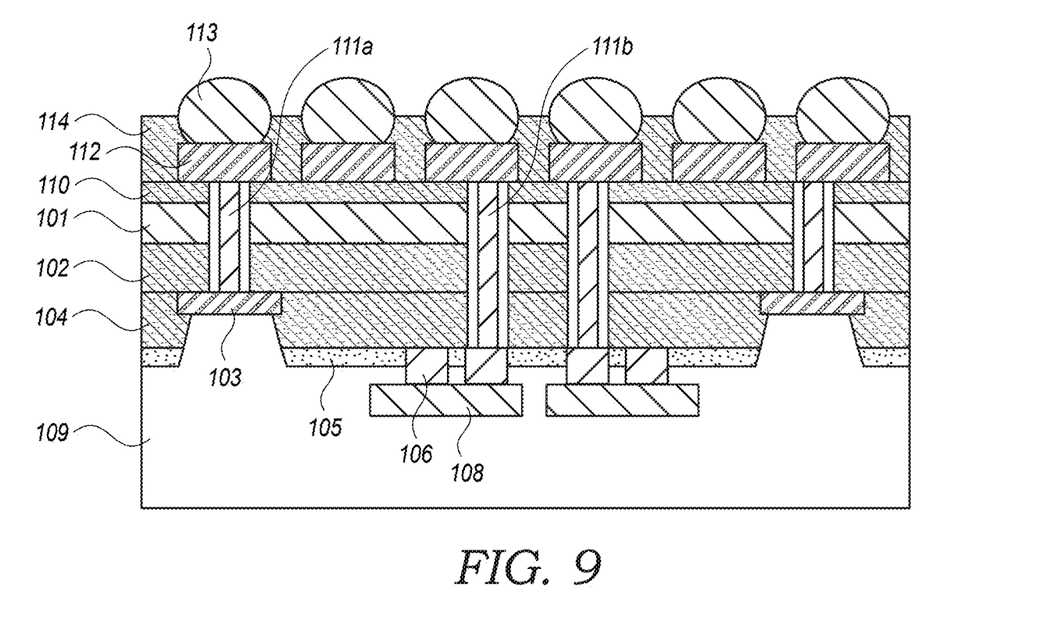

Turning to FIG. 9, external contacts of the assembly can be provided over the rear surface of the first semiconductor device 101 in contact with the first and second pluralities of TSVS 111a and 111b, in accordance with one embodiment of the present disclosure. The external contacts can include arrays of pads 112 and solder balls 113, optionally partially surrounded by an underfill or mold material 114. In other embodiments, other external contacts (e.g., pillars, pins, bare pads, etc.) could alternatively or additionally be formed.

Figure 10:
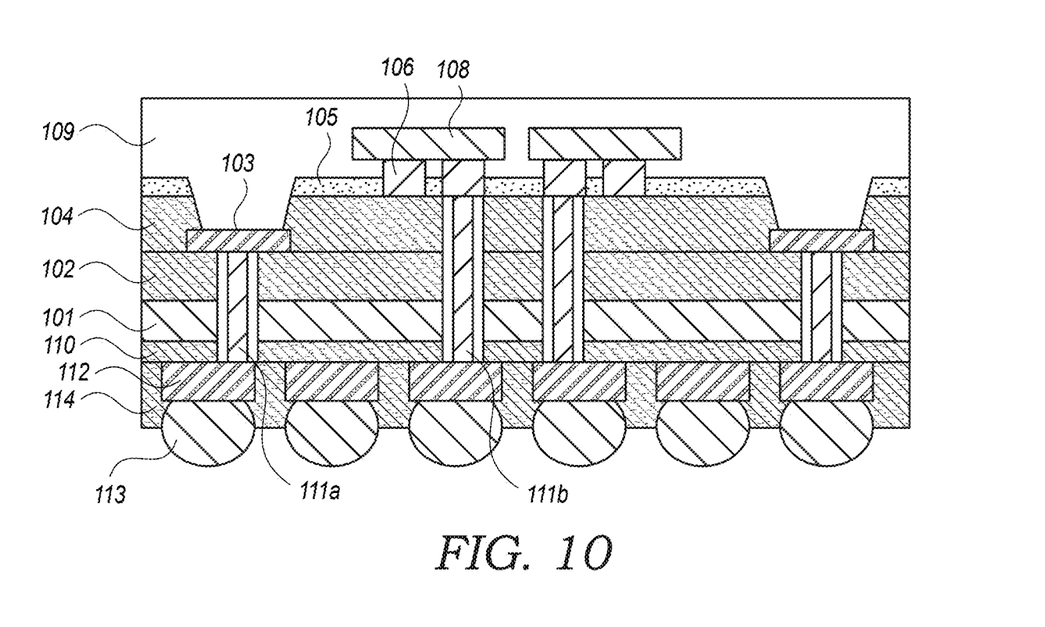

The assembly illustrated in FIG. 9 can be singulated from a wafer- or panel-level at this point, or optionally be subjected to further processing. For example, as illustrated in FIG. 10, the overall height of the assembly can be reduced by thinning the mold material 109 to reduce the amount thereof overlying the additional semiconductor devices 108 (e.g., to improve the thermal performance of the assembly). In some embodiments, the portion of the mold material 109 overlying the additional semiconductor devices 108 can be completely removed, exposing the upper surfaces of the additional semiconductor devices 108 and making them coplanar with the upper surface of the mold material 109 (e.g., to facilitate the attachment of a lid or other heat-extraction device to the assembly and/or the rear surfaces of the additional semiconductor devices 108).

Although in the foregoing example embodiments semiconductor device assemblies have been illustrated and described as including two additional semiconductor devices, disposed at a same distance from a rear surface of a first semiconductor device, in other embodiments the number and position of second semiconductor devices need not be so limited. Rather, as will be readily apparent to those of skill in the art, embodiments of the present invention can have more or fewer second semiconductor devices, optionally at different distances from the rear surface of the first semiconductor device (e.g., by analogously adding additional passivation layers to support additional device pads at different heights) without departing from the scope of the present disclosure.

In accordance with one aspect of the present disclosure, the semiconductor device assemblies illustrated and described above could include memory dies, such as dynamic random access memory (DRAM) dies, NOT-AND (NAND) memory dies, NOT-OR (NOR) memory dies, magnetic random access memory (MRAM) dies, phase change memory (PCM) dies, ferroelectric random access memory (FeRAM) dies, static random access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could include logic dies (e.g., controller dies, processor dies, etc.), or a mix of logic and memory dies (e.g., a memory controller die and a memory die controlled thereby).

Figure 11:
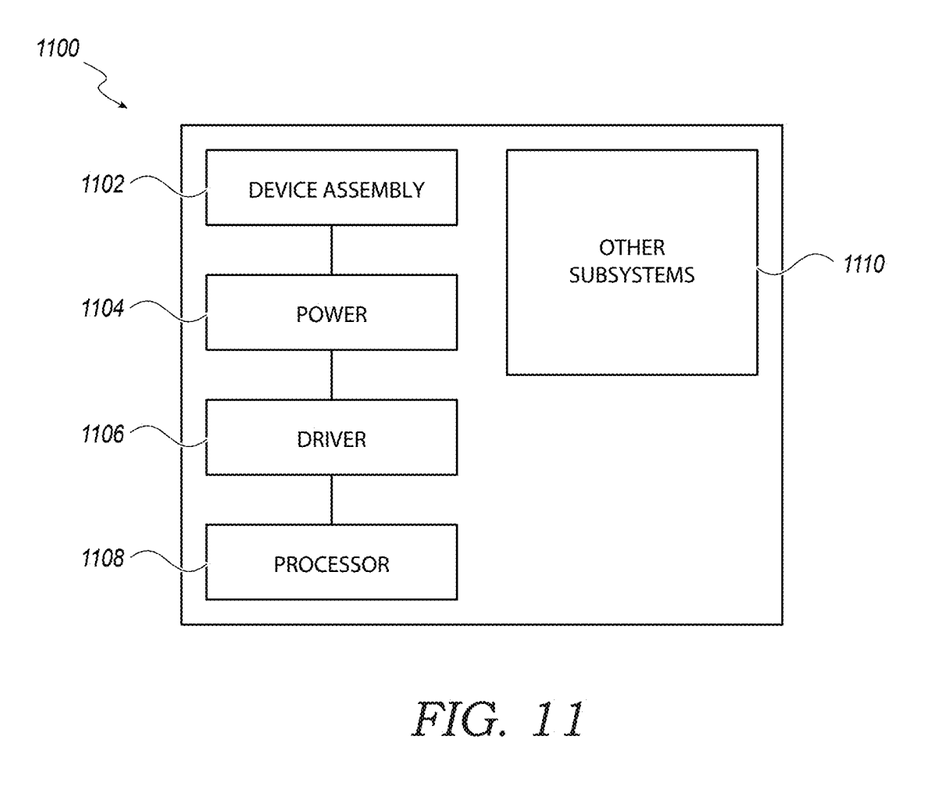
FIG. 11 is a schematic view showing a system that includes a semiconductor device assembly configured in accordance with an embodiment of the present disclosure.

Any one of the semiconductor devices and semiconductor device assemblies described above can be incorporated into any of a myriad of larger and/or more complex systems, a representative example of which is system 1100 shown schematically in FIG. 11. The system 1100 can include a semiconductor device assembly (e.g., or a discrete semiconductor device) 1102, a power source 1104, a driver 1106, a processor 1108, and/or other subsystems or components 1110. The semiconductor device assembly 1102 can include features generally similar to those of the semiconductor devices described above. The resulting system 1100 can perform any of a wide variety of functions, such as memory storage, data processing, and/or other suitable functions. Accordingly, representative systems 1100 can include, without limitation, hand-held devices (e.g., mobile phones, tablets, digital readers, and digital audio players), computers, vehicles, appliances and other products. Components of the system 1100 may be housed in a single unit or distributed over multiple, interconnected units (e.g., through a communications network). The components of the system 1100 can also include remote devices and any of a wide variety of computer readable media.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly comprising:
    a first semiconductor device having a front surface and a rear surface, a plurality of front-side pads disposed over the front surface at a first distance from the rear surface, and a plurality of additional device pads disposed over the front surface at a second distance from the rear surface greater than the first distance;
    at least one second semiconductor device in physical and electrical contact with a top side of each of the plurality of additional device pads; and
    an encapsulant material at least partially surrounding the at least one second semiconductor device and covering a top side of each of the plurality of front-side pads;

a first plurality of TSVs, each extending from the rear surface through the first semiconductor device to a bottom side of a corresponding one of the plurality of front-side pads; and a second plurality of TSVs, each extending from the rear surface through the first semiconductor device to a bottom side of a corresponding one of the plurality of additional device pads.

2. The semiconductor device assembly of claim 1, wherein the top side of at least one of the plurality of front-side pads includes a mechanical deformation from a probe operation.

3. The semiconductor device assembly of claim 1, wherein the plurality of front side pads is electrically coupled to circuitry of the first semiconductor device.

4. The semiconductor device assembly of claim 1, wherein each of the second plurality of TSVs is electrically isolated from the first semiconductor device.

5. The semiconductor device assembly of claim 1, wherein the front surface of the first semiconductor device is at least partially covered by a layer of dielectric material carrying the plurality of additional device pads.

6. The semiconductor device assembly of claim 5, wherein the layer of dielectric material includes a plurality of openings, each aligned with the top side of a corresponding one of the plurality of front-side pads.

7. The semiconductor device assembly of claim 6, wherein the encapsulant material extends into the plurality of openings and contacts the top side of each of the plurality of front-side pads.

8. The semiconductor device assembly of claim 1, wherein the encapsulant material has an upper surface coplanar with an upper surface of the at least one second semiconductor device.

9. The semiconductor device assembly of claim 1, wherein the encapsulant material extends over an upper surface of the at least one second semiconductor device.

10. The semiconductor device assembly of claim 1, wherein each of the first plurality of TSVs has a first length corresponding to the first distance, wherein each of the second plurality of TSVs has a second length corresponding to the second distance, and wherein the second length is greater than the first length.

11. The semiconductor device assembly of claim 1, further comprising an array of external contacts at the rear surface of the first semiconductor device, each operatively coupled to a corresponding one of either the first plurality of TSVs or the second plurality of TSVs.

12. A semiconductor device assembly comprising:
a first semiconductor device having a front surface and a rear surface, a plurality of front-side pads disposed over the front surface, and a plurality of additional device pads disposed over the front surface;
at least one second semiconductor device in physical and electrical contact with a top side of each of the additional device pads; and
an encapsulant material at least partially surrounding the at least one second semiconductor device and covering a top side of each of the plurality of front-side pads;
a first plurality of TSVs, each extending from the rear surface through the first semiconductor device to a bottom side of a corresponding one of the plurality of front-side pads; and
a second plurality of TSVs, each extending from the rear surface through the first semiconductor device to a bottom side of a corresponding one of the plurality of additional device pads,
wherein each of the second plurality of TSVs is electrically isolated from the first semiconductor device.

13. The semiconductor device assembly of claim 12, wherein the top side of at least one of the plurality of front-side pads includes a mechanical deformation from a probe operation.

14. The semiconductor device assembly of claim 12, wherein the plurality of front side pads is electrically coupled to circuitry of the first semiconductor device.

15. The semiconductor device assembly of claim 12, wherein the front surface of the first semiconductor device is at least partially covered by a layer of dielectric material carrying the plurality of additional device pads.

16. The semiconductor device assembly of claim 15, wherein the layer of dielectric material includes a plurality of openings, each aligned with the top side of a corresponding one of the plurality of front-side pads.

17. The semiconductor device assembly of claim 16, wherein the encapsulant material extends into the plurality of openings and contacts the top side of each of the plurality of front-side pads.

18. The semiconductor device assembly of claim 12, wherein the encapsulant material has an upper surface coplanar with an upper surface of the at least one second semiconductor device.

19. The semiconductor device assembly of claim 12, wherein the encapsulant material extends over an upper surface of the at least one second semiconductor device.

20. A semiconductor device assembly comprising:
a first semiconductor device having a front surface and a rear surface, a plurality of front-side pads disposed over the front surface, and a plurality of additional device pads disposed over the front surface;
at least one second semiconductor device in physical and electrical contact with a top side of each of the additional device pads; and
an encapsulant material at least partially surrounding the at least one second semiconductor device and covering a top side of each of the plurality of front-side pads;
a first plurality of TSVs, each extending from the rear surface through the first semiconductor device to a bottom side of a corresponding one of the plurality of front-side pads; and
a second plurality of TSVs, each extending from the rear surface through the first semiconductor device to a bottom side of a corresponding one of the plurality of additional device pads, wherein the top side of at least one of the plurality of front-side pads includes a mechanical deformation from a probe operation.

* * * * *